(12) United States Patent
Nguyen et al.

(10) Patent No.: US 9,347,995 B2
(45) Date of Patent: May 24, 2016

(54) SYSTEM AND METHOD FOR DETECTING BATTERY FAILURE DURING A NON-OPERATING EVENT

(71) Applicant: Johnson Controls Technology Company, Holland, MI (US)

(72) Inventors: Thanh T. Nguyen, Mequon, WI (US); Junwei Jiang, Glendale, WI (US)

(73) Assignee: Johnson Controls Technology Company, Holland, MI (US)

( * ) Notice: Subject to any disclaimer, the term of this patent is extended or adjusted under 35 U.S.C. 154(b) by 174 days.

(21) Appl. No.: 13/757,228

(22) Filed: Feb. 1, 2013

(65) Prior Publication Data

US 2013/0214790 A1    Aug. 22, 2013

Related U.S. Application Data

(60) Provisional application No. 61/600,624, filed on Feb. 18, 2012.

(51) Int. Cl.
| | | |
|---|---|---|
| *H01M 10/44* | (2006.01) | |
| *G01R 31/36* | (2006.01) | |
| *B60L 3/00* | (2006.01) | |
| *B60L 11/18* | (2006.01) | |
| *H02J 7/00* | (2006.01) | |

(52) U.S. Cl.
CPC ........... *G01R 31/3606* (2013.01); *B60L 3/0046* (2013.01); *B60L 11/1861* (2013.01); *B60L 11/1864* (2013.01); *B60L 2260/22* (2013.01); *G01R 31/3648* (2013.01); *G01R 31/3658* (2013.01); *G01R 31/3689* (2013.01);
(Continued)

(58) Field of Classification Search
CPC ...... G01R 31/3606; G01R 31/40; G08B 1/08; H01M 10/44
USPC .................... 324/426, 430, 432, 433, 764.01, 324/761.01; 320/101, 103, 138; 307/21, 23, 307/43, 44, 66; 136/293
See application file for complete search history.

(56) References Cited

U.S. PATENT DOCUMENTS

| | | | | | |
|---|---|---|---|---|---|
| 5,193,538 | A | * | 3/1993 | Ekwall | ................... A61N 1/378 607/29 |
| 5,349,535 | A | * | 9/1994 | Gupta | ............................ 702/63 |

(Continued)

FOREIGN PATENT DOCUMENTS

WO        9701725 A1    1/1997

OTHER PUBLICATIONS

International Search Report and Written Opinion for PCT Application No. PCT/US2013/024781 dated Jul. 16, 2014; 10 pgs.

*Primary Examiner* — Patrick Assouad
*Assistant Examiner* — Taqi Nasir
(74) *Attorney, Agent, or Firm* — Fletcher Yoder, P.C.

(57) ABSTRACT

A system is provided for monitoring an energy-storing apparatus during a non-operating event of a mechanism that draws energy from the energy-storing apparatus, which includes a plurality of energy-storing cells. The system includes a plurality of sensing units, each of which is coupled to a subset of the plurality of cells and is configured to monitor conditions of the corresponding subset of cells during the non-operating event. The system further includes a wireless communication unit and a power source. The wireless communication unit is coupled to each of the sensing units and configured to communicate a signal indicative of one of the monitored conditions of the corresponding subset of cells to a computing device. The power source provides energy to the sensing units and the wireless communication unit during the non-operating event.

20 Claims, 6 Drawing Sheets

(52) U.S. Cl.
CPC ............ *H02J 7/0021* (2013.01); *Y02T 10/7005* (2013.01); *Y02T 10/7044* (2013.01); *Y02T 10/7055* (2013.01); *Y02T 10/7061* (2013.01); *Y02T 90/16* (2013.01)

(56) References Cited

U.S. PATENT DOCUMENTS

| | | | | |
|---|---|---|---|---|
| 5,488,282 | A * | 1/1996 | Hayden | B64G 1/425 136/293 |
| 5,703,464 | A * | 12/1997 | Karunasiri | B60L 3/0046 180/65.8 |
| 5,869,951 | A * | 2/1999 | Takahashi | G01R 31/361 320/104 |
| 7,928,735 | B2 * | 4/2011 | Huang et al. | 324/426 |
| 8,229,624 | B2 * | 7/2012 | Breed | B60R 21/0132 701/36 |
| 2005/0038614 | A1 | 2/2005 | Botts et al. | |
| 2011/0178654 | A1 | 7/2011 | Bauerle et al. | |
| 2012/0038473 | A1* | 2/2012 | Fecher | B60L 11/1851 340/455 |

* cited by examiner

SYSTEM AND METHOD FOR DETECTING BATTERY FAILURE DURING A NON-OPERATING EVENT

CROSS-REFERENCE TO RELATED APPLICATIONS

The present application claims priority under 35 U.S.C. §119(e) to U.S. Provisional Patent Application Ser. No. 61/600,624, filed Feb. 18, 2012, which is incorporated herein by reference in its entirety.

BACKGROUND

Unless otherwise indicated herein, the materials described in this section are not prior art to the claims in this application and are not admitted to be prior art by inclusion in this section.

A conventional battery pack is detachably attached and supplies power to a mechanism, such as a vehicle or a computing device. The conventional battery pack typically includes a chargeable and dischargeable battery, a protection circuit for protecting the battery, and a management circuit portion for posting a state of the battery to the mechanism.

Typically, the protection circuit includes a current detecting circuit for detecting an overcurrent or an undercurrent, a charge detecting circuit for detecting a charge level of the battery, an overcurrent/undercurrent and undervoltage/overcharge protection circuit for protecting the battery from undesirable current and charge conditions, and a temperature detecting circuit for detecting a temperature in the battery pack. However, the current and charge detecting circuit as well as the management circuit portion are only configured to operate during operation of the corresponding mechanism.

Therefore, there exists a need for a battery management unit that is configured to monitor a battery assembly during non-operating events of a mechanism that draws energy from the battery assembly.

SUMMARY

Disclosed herein are improved energy storage and sensing batteries.

In one aspect, an embodiment of a system is provided for monitoring an energy-storing apparatus during a non-operating event of a mechanism that draws energy from the energy-storing apparatus, which includes a plurality of energy-storing cells. The system includes a plurality of sensing units, each of which is coupled to a subset of the plurality of cells and is configured to monitor conditions of the corresponding subset of cells during the non-operating event. The system further includes a wireless communication unit and a power source. The wireless communication unit is coupled to each of the sensing units and configured to communicate a signal indicative of one of the monitored conditions of the corresponding subset of cells to a computing device. The power source provides energy to the sensing units and the wireless communication unit during the non-operating event.

In another aspect, a vehicle includes a system for monitoring an energy-storing apparatus during a non-operating event of a mechanism that draws energy from the energy-storing apparatus, which includes a plurality of energy-storing cells.

In yet another aspect, a method is provided for monitoring an energy-storing apparatus during a non-operating event of a mechanism that draws energy from the energy-storing apparatus, which includes a plurality of energy-storing cells. The method includes monitoring conditions occurring within a subset of the plurality of cells during the non-operating event via a sensing unit associated with the subset of cells, and generating and communicating a signal indicative of one of the monitored conditions of the corresponding subset of cells to a computing device via a wireless communication unit coupled to the sensing unit.

These as well as other aspects, advantages, and alternatives will become apparent to those of ordinary skill in the art by reading the following detailed description, with reference where appropriate to the accompanying drawings. Further, it should be understood that the disclosure provided in this summary section and elsewhere in this document is intended to discuss the embodiments by way of example only acid not by way of limitation.

DETAILED DESCRIPTION

In the following detailed description, reference is made to the accompanying figures, which firm a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Overview

As stated above, when a battery pack, associated with a mechanism, such as a vehicle, is not charging during a non-operating event of the mechanism, there is no easy way to detect battery failures inside the battery pack. This is due to the fact that typically failure detection mechanisms or circuits are activated during operating events of the mechanism or of an associated unit that draws power from the battery pack.

Accordingly, an exemplary embodiment of a novel battery pack monitoring system is provided. The monitoring system is configured to monitor temperatures, strains, voltages, and other desirable conditions. The battery pack may include or may be coupled to a wireless communication unit. In accordance with one exemplary embodiment, the monitoring system is configured to continue operating on self-harvesting power during non-operating events of the mechanism that draws electrical power form the battery pack, and to generate/trigger a signal to warn a user via the wireless communication unit whenever the status of the battery pack warrants it.

Figure 1:
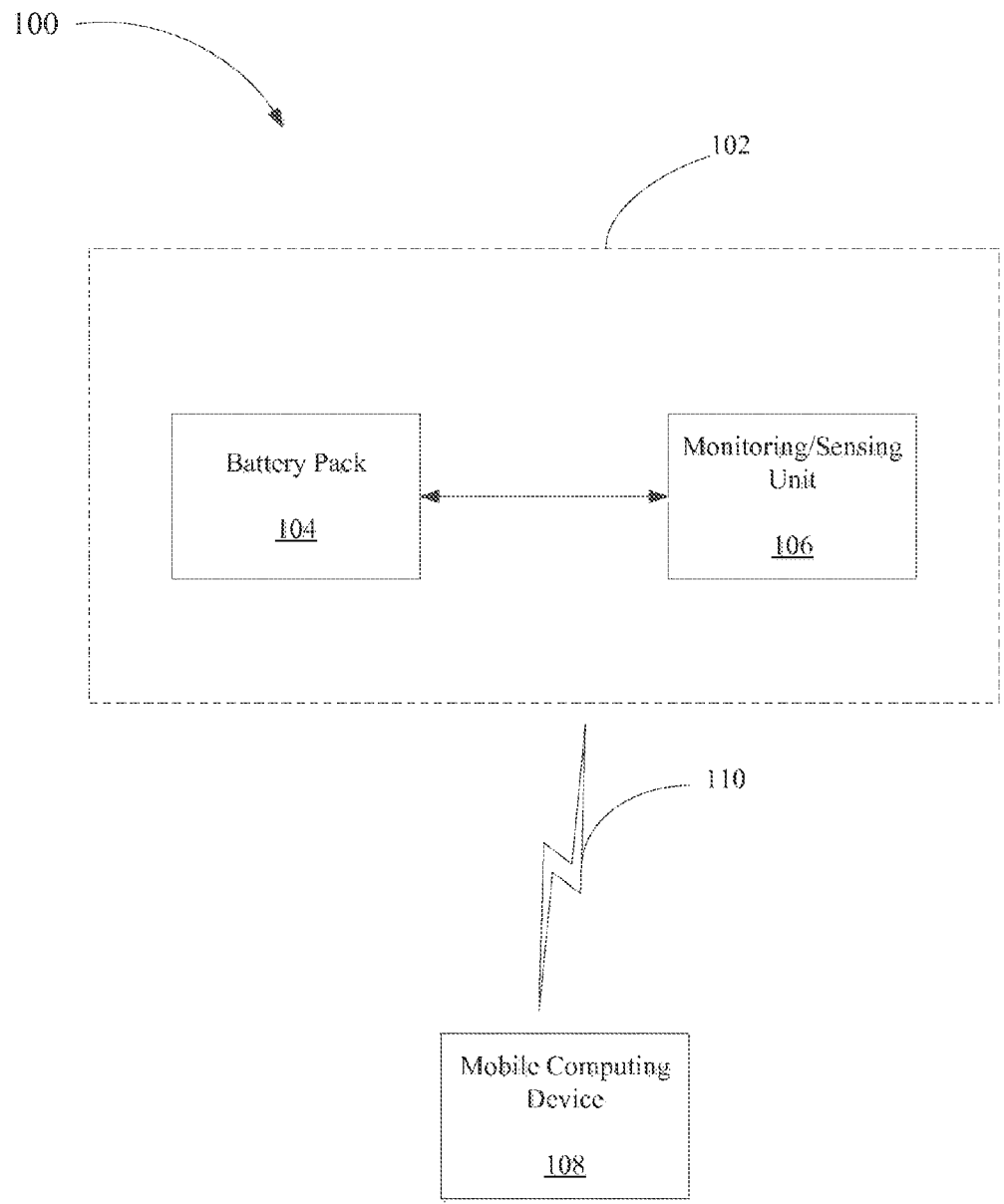
FIG. 1 is a block diagram illustrating an exemplary embodiment of a system configured to monitor a battery pack during non-operating (off-key) events.

Now referring to FIG. 1, an exemplary embodiment of a system 100 configured to monitor a battery pack 104 during off-key events of a mechanism that draws energy from the battery pack is illustrated. System 100 includes a battery apparatus 102 communicatively coupled to a computing device 108 via a communication link 110. Battery apparatus 102 includes battery pack 104 and a monitoring system 106. System 100 may be installed on a vehicle, such as a Start-Stop, a Micro Hybrid, a Hybrid, a Plug-in Hybrid, or an Electric vehicle that has a mechanism (not shown), such as an electric motor, capable of generating mechanical force from electric power to drive the vehicle. As such, battery pack 10 supplies direct current electric power to the mechanism and/or to accessory loads, and is also electrically charged with direct current electric power supplied from the mechanism. In one embodiment, in addition to the electric motor the mechanism includes an inverter (not shown) to drive the motor, which may be used for starting an engine mounted in a hybrid vehicle. The inverter is configured to receive direct current electric power from battery pack 104, converts it to alternate current electric power and supplies it to the motor, or converts alternate current electric power generated by the motor to direct current electric power and supplies it to battery pack 104. Moreover, a battery may be configured to drive the motor and/or generator to power accessory loads, via direct currents so no inverter may be involved.

Figure 2A:
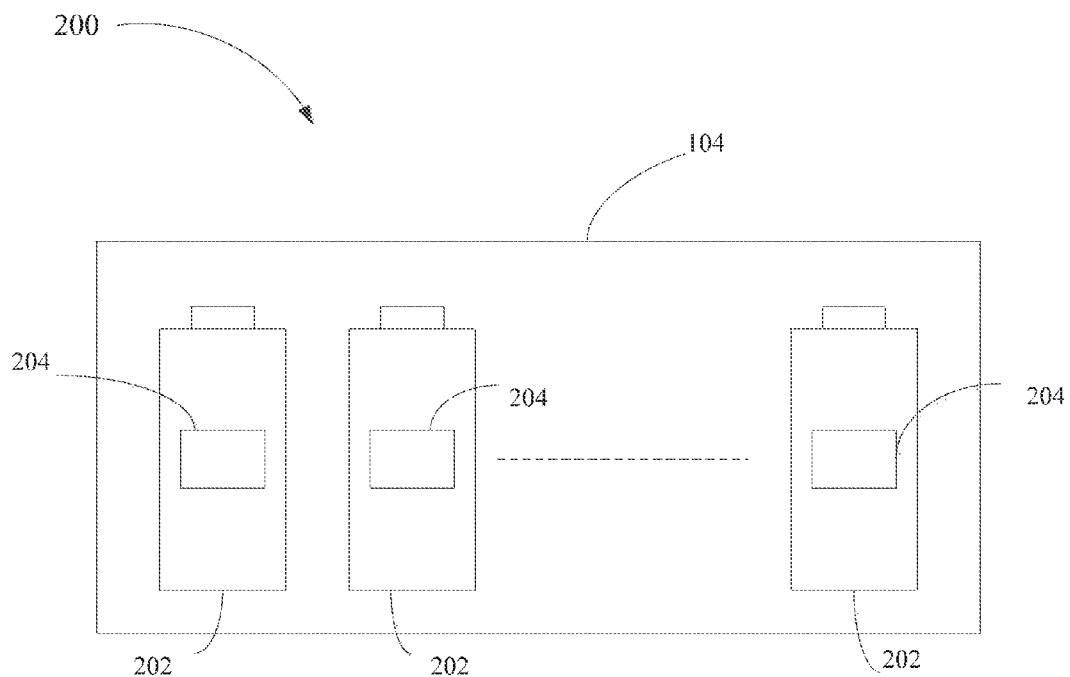
FIGS. 2A-B are block diagrams illustrating an exemplary embodiment of a battery pack having a monitoring system, a wireless communication unit, and a self-harvesting power source.
Figure 2B:
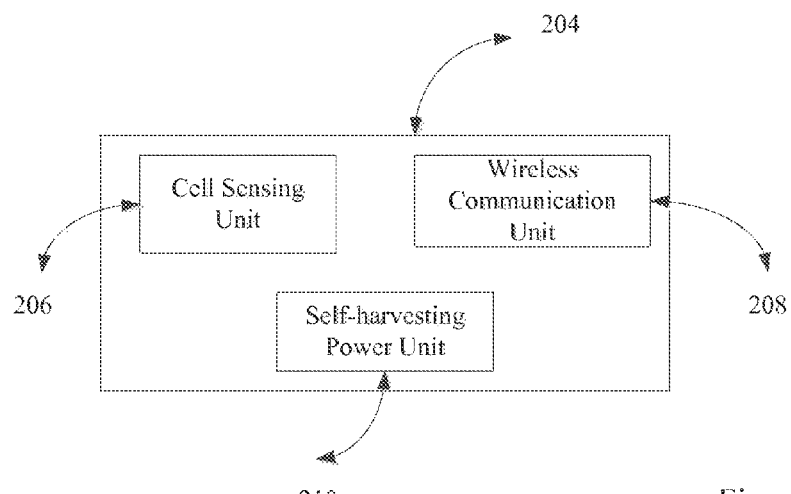

Referring to FIGS. 2A-B, battery pack 104 includes a plurality of rechargeable electrochemical cells 202, which can have substantially the same capacity and are connected in series. As known to one of ordinary skill in the art, an electrochemical cell consists of a cathode and an anode separated and connected by an electrolyte. The electrolyte conducts ions but is an insulator to electrons. During a discharge state, an ion leaves the anode and migrates through the electrolyte to the cathode while its associated electron is collected by a current collector to be used to power a coupled electric device. In one embodiment, battery pack 104 includes a housing or container that may be formed of a single polymer monobloc container.

Now referring to FIGS. 2A-B, each cell 202 includes a sensing and monitoring unit 204, which in turn includes a sensor 206, a wireless communication unit 208, and a self harvesting power source 210. Alternatively, a cell group may include components 204, 206, 208, and 210. In one embodiment, sensor 206, which can be an in-situ sensing unit, is a temperature sensor, a voltage sensor, a pressure sensor, or any other sensor configured to sense a cell condition that should be monitored, in situ sensor 206 may be integrated inside an electrically insulating mandrel (not shown) to monitor conditions occurring deep within cell 202. As such, the sensed conditions may be thermal levels, voltage levels, internal pressure levels, or any other condition that should be monitored to maintain a desirable operating status of battery pack 104.

In one exemplary embodiment, a microsensor integrated circuit (IC) chip may be used as in-situ sensor 206, and includes supporting electronic functions. In one embodiment, in case of a temperature sensor, IC chip includes a temperature sensor head. For this temperature embodiment, a conductive coating can be applied to cell 202 to form the electrode leads and connect temperature sensor to these leads prior to the winding or cell assembly process. Moreover, temperature sensor may be formed of any temperature sensitive material that offers a desirable quick response to temperature changes, and a robust, linear electronic signal response in the temperature range that is expected within cell 202. This temperature sensitive material enables the temperature sensor to produce a repeatable response that is desirably linear with or proportional to the temperature. Further, the temperature sensitive material may be sprayed or drop-cast directly to the sensor electrodes. One such material is Graphene, which is known to react very fast to temperature changes, thereby providing more reaction time for abuse tolerance and ensuring the best battery performance. The microsensor IC chip may also be used as a voltage sensor, a pressure sensor, or any other desirable sensor that monitors select conditions of cell 202.

In one exemplary embodiment, in-situ sensor 206 includes micro-processing unit 212 and a memory unit 214 for performing and storing monitoring instructions. As shown in FIG. 1, a data communications link 110 is established between battery apparatus 102 and computing device 108, which can be a user's mobile device. Based on the monitoring instructions, upon detection of an undesirable condition of a corresponding cell 202, micro-processing unit generates a signal indicative of the detected condition and wireless communication unit 208 converts the indicative signal into a digital signal for communication to computing device 108 via communications link 110.

In another embodiment, in case battery pack 104 includes only one wireless communication unit 208, then each integrated sensing IC chip may be connected to the positive and negative terminals of a corresponding cell 202, which are in-turn connected to a power line (not shown) that enables data communication to the one wireless communication unit 208. The power line includes another integrated circuit chip (not shown), hereafter referred to as power line chip (PL chip) that is connected to in-situ sensors 206 and is configured to digitize sensor signals received from sensors 206 and to communicate them to computing device 108 via wireless communication unit 208. Moreover, the PL chip is configured to provide cell measurement data via power line 310 through a modulated digital signal. In one embodiment, an advanced error mitigation algorithm can be employed with a suitable level of error correction and protection, thereby minimizing any risk of sending incorrect data. This fault-tolerant approach can correct a wide variety of impediments to the PL chip including impulsive noise, and continuous tone noise. The PL chip is configured to provide a robust and reliable operation for this proposed in-situ configuration, including a concurrent use of a high number of cells 202 wired in series.

As discussed above, communications link 110 couples wireless communications unit 208 to computing device 108. Wireless communication unit 208 can be a Bluetooth communication unit, a Radio Frequency (RIP) communication unit, a ZigBee communication unit, a 3G communication unit, or any other suitable digital communication unit. In one embodiment, wireless communication unit 208 is internal to battery pack 104.

As stated above, monitoring and sensing unit 106 is configured to continue operating on self-harvesting power during non-operating events of the mechanism that draws electrical power form the battery pack. As such, both sensing unit 206 and wireless communication unit 208 are coupled to self-harvesting power source 210 during non-operating events of the associated mechanism. Self-harvesting power source 210 can harvest electrical power from vibration energy, solar energy, or any other suitable energy.

As known to one of ordinary skill in the art, one kind of electrochemical cells includes lithium-ion (Li-ion) cells whose chemistry is very sensitive to temperature. In fact, a consistent 10-15° C. temperature increase can reduce a cell life by half. Further, uneven temperature distribution and localized hot spots that can occur in a Li-ion cell pose a technical challenge that may require innovation in the battery concept. To develop an efficient thermal management solution for cells 202, thermal conductivity can be increased, thermal events are recognized, and heat generation is reduced.

Figure 3:
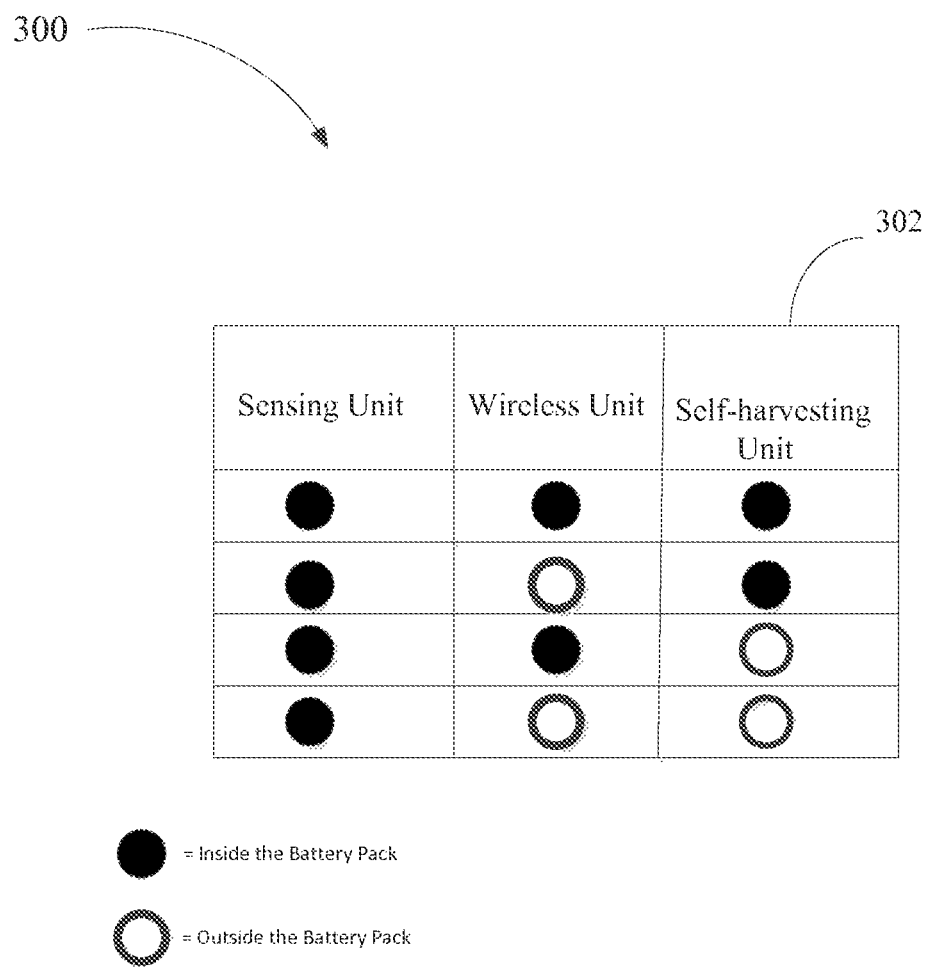
FIG. 3 is a table listing alternative locations of the wireless communication unit and the self-harvesting power source in relation to the battery pack.

Now referring to FIG. 3, a table 302 lists multiple approaches on where to place the different components of monitoring and sensing unit 106 with respect to battery pack 104 and cells 202. As discussed above, each cell 202 includes a corresponding sensor 206, a wireless communication unit 208, and a self-harvesting power source 210. Alternatively, one wireless communication unit 208 and one self-harvesting power source 210 are associated with a subset (module) of the plurality of cells 202. In one embodiment, either or both of wireless communication unit 208 and self-harvesting power source 210 are positioned outside of battery pack 104. Alternatively, either or both of wireless communication unit 208 and self-harvesting power source 210 are internal to battery pack 104.

As mentioned above, in-situ sensors 206 and Pt, chip include micro-processing units and memory units. Each of the processing units can be implemented on a single-chip. For example, various architectures can be used including dedicated or embedded microprocessor (μP), a microcontroller (μC), or any combination thereof. Each of the memory units may be of any type of memory now known or later developed including but not limited to volatile memory (such as RAM), non-volatile memory (such as ROM, flash memory, etc.) or any combination thereof, which may store software that can be accessed and executed by the processing units, for example.

Figure 4:
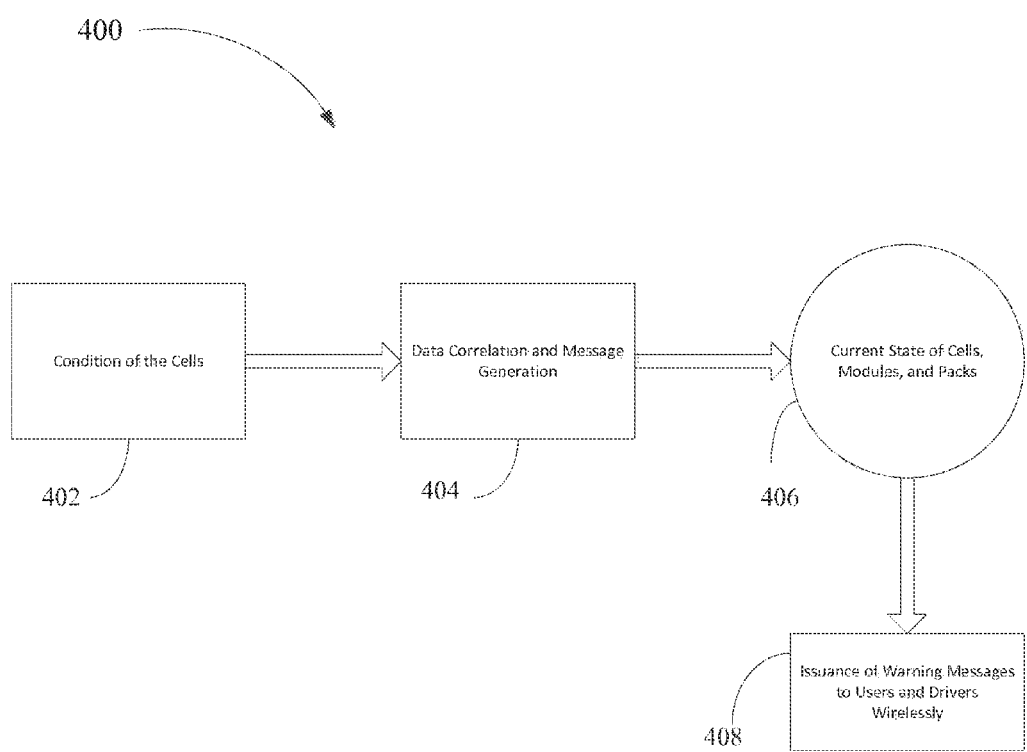
FIG. 4 is a flow chart illustrating a method for monitoring one or more conditions of the battery pack during non-operating events.

Now referring to FIG. 4, a block diagram 400 illustrates a process flow of the method of monitoring cells 202 and communicating their detected conditions to computing device 108. As shown, upon detection, during off-key events, of cell conditions that may correspond to temperature, voltage, strain, or other conditions, processing unit 112 is configured to determine whether one of the monitored conditions exceeds a corresponding threshold value. Based on this determination, processing unit 112 correlate the data associated with the detected conditions of each cell 202 with an indicative message. As such, a current state of cells 202, modules, and battery pack 104 is established. If one of the established states has an undesirable feature, then a warning message is generated and communicated wirelessly to a user and/or a driver.

Figure 5:
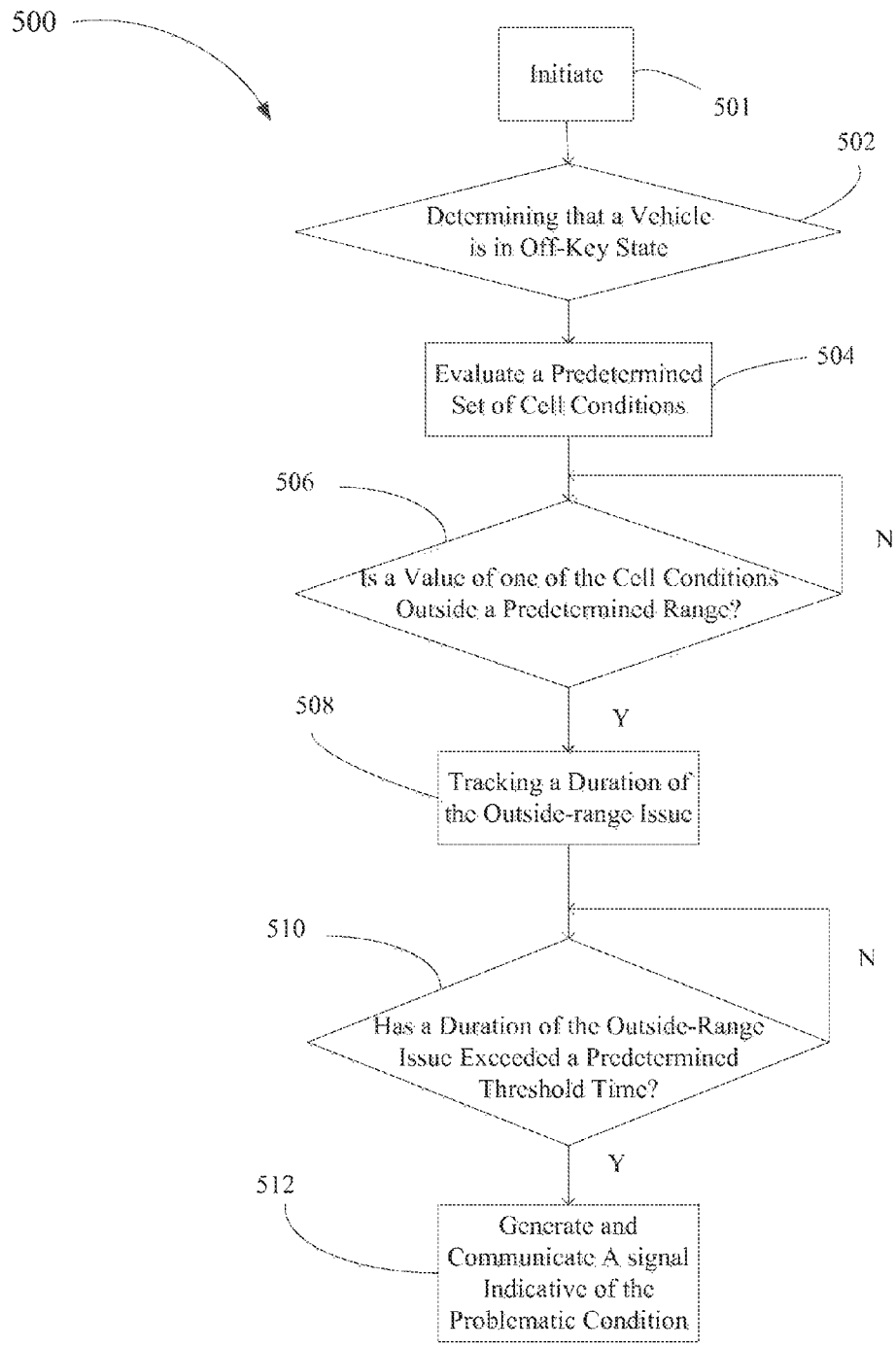
FIG. 5 is a schematic diagram illustrating a conceptual partial view of an example computer program product.

Now referring next to FIG. 5, a flow diagram shows an exemplary method 500, initiated at step 501, for sensing conditions of electrochemical cells having in-situ sensors and communicating signals indicative of detected cell conditions. At step 502, processing unit 112 is configured to determine whether the vehicle is an off-key (non-operating) state. In the affirmative, processing unit 112 is configured to analyze each cell 202 and evaluate a predetermined set of conditions, at step 504. At step 506, processing unit 112 determines whether a value of one the monitored conditions is outside a corresponding predetermined range. In the affirmative, processing unit 112 is configured to track a time duration during which values of the identified condition remain outside of the corresponding predetermined range, at step 508. Subsequently, processing unit 112 determines whether the tracked time duration has exceeded a predetermined duration threshold, at step 510. In the affirmative, processing unit 112 triggers a generation of a signal indicative of the issue with the identified condition, and a communication of the indicative signal to computing device 108, which is accessible by a user that needs to be informed of the status or condition of battery pack 104, at step 512.

Figure 6:
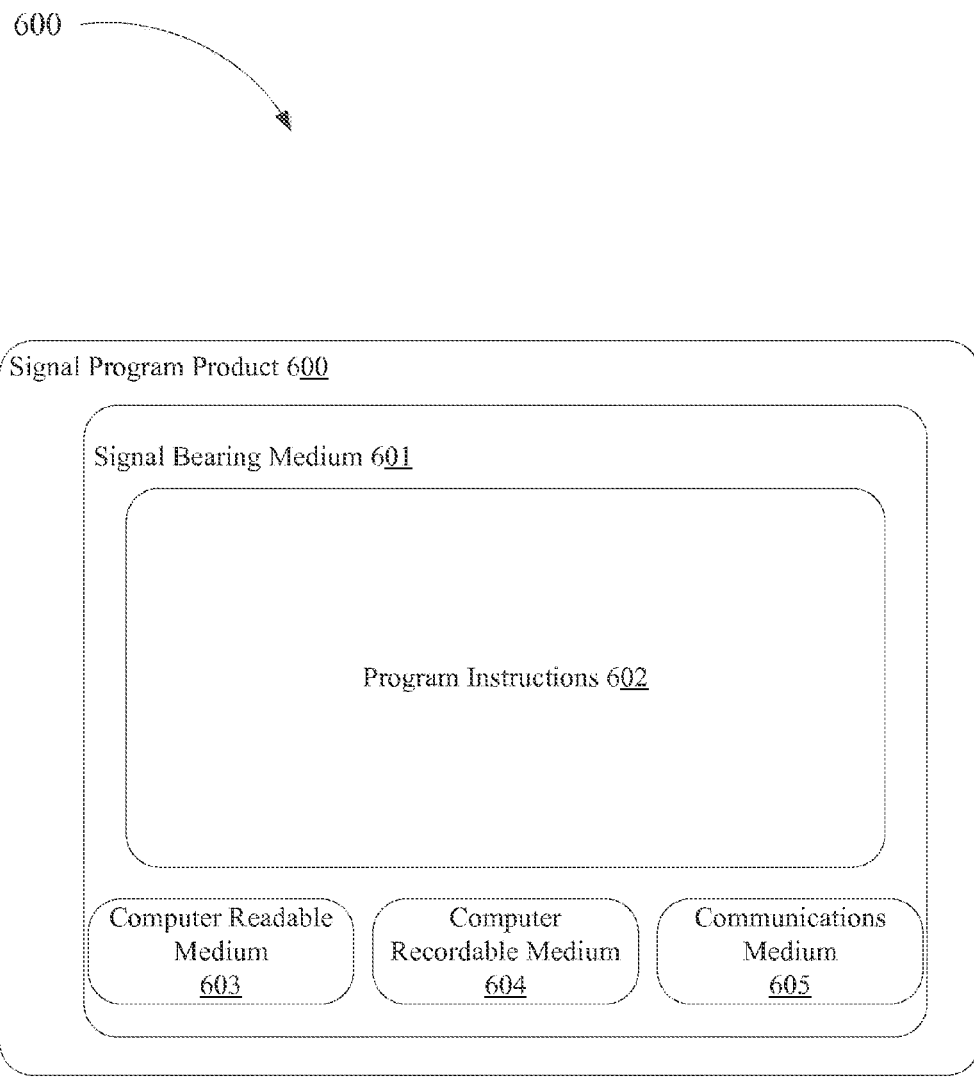
FIG. 6 is a schematic illustrating a conceptual partial view of an example computer program product that includes a computer program for executing a computer process on a computing device.

In some embodiments, the disclosed method may be implemented as computer program instructions encoded on a computer-readable storage media in a machine-readable format. FIG. 6 is a schematic illustrating a conceptual partial view of an example computer program product 600 that includes a computer program for executing a computer process on a computing device, arranged according to at least some embodiments presented herein. In one embodiment, the example computer program product 600 is provided using a signal bearing medium 601. The signal bearing medium 601 may include one or more programming instructions 602 that, when executed by a processing unit may provide functionality or portions of the functionality described above with respect to FIG. 5. Thus, for example, referring to the embodiment shown in FIG. 5, one or more features of blocks 502-512, may be undertaken by one or more instructions associated with the signal bearing medium 501.

In some examples, signal bearing medium 601 may encompass a non-transitory computer-readable medium 603, such as, but not limited to, a hard disk drive, memory, etc. In some implementations, signal bearing medium 601 may encompass a computer recordable medium 604, such as, but not limited to, memory, read/write (R/W) CDs, R/W DVDs, etc. In some implementations, signal bearing medium 601 may encompass a communications medium 605, such as, but not limited to, a digital and/or an analog communication medium a fiber optic cable, a waveguide, a wired communications link, etc.).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims, along with the full scope of equivalents to which such claims are entitled. It is also to be understood that the terminology used herein is for the purpose of describing particular embodiments only, and is not intended to be limiting.

What is claimed is:

1. A system for monitoring an energy-storing apparatus during a non-operating event of a mechanism that draws energy from the energy-storing apparatus, the apparatus including a plurality of energy-storing cells, the system comprising:
   a plurality of sensing units, each one of the sensing units being coupled to a subset of the plurality of cells, wherein each one of the sensing units is configured to monitor conditions of a corresponding subset of cells during the non-operating event, wherein the non-operating event corresponds to when electrical current is not flowing to or from the energy-storing apparatus;
   a wireless communication unit coupled to each of the sensing units and configured to communicate a signal indicative of one of the monitored conditions of the corresponding subset of cells to a computing device, wherein the energy-storing apparatus is configured to provide energy to the plurality of sensing units and the wireless communication unit during an operating event;

a self-harvesting power source configured to provide energy to the plurality of sensing units and the wireless communication unit only when the non-operating event begins; and a processor configured to switch a supply of the energy from the energy-storing apparatus to the self-harvesting power source when the non-operating event begins.

2. The system of claim 1, wherein the monitored conditions includes one of a voltage status, a temperature status, a strain status, and a pressure status.

3. The system of claim 1, wherein the self-harvesting power is generated by one of vibration energy or solar energy.

4. The system of claim 1, wherein each of the wireless communication unit and the self-harvesting power source is located within or outside the energy-storing apparatus.

5. The system of claim 1, wherein each subset of the plurality of cells comprises one cell and each of the plurality of sensing units is associated with one of the plurality of cells.

6. A vehicle comprising:

a system for monitoring an energy-storing apparatus during a non-operating event of the vehicle, the apparatus including a plurality of energy-storing cells, the system comprising:

a plurality of sensing units, each one of the sensing units being coupled to a subset of the plurality of cells, wherein each one of the sensing units is configured to monitor conditions of a corresponding subset of cells during the non-operating event, wherein the non-operating event corresponds to when electrical current is not flowing to or from the energy-storing apparatus;

a wireless communication unit coupled to each of the sensing units and configured to communicate a signal indicative of one of the monitored conditions of the corresponding subset of cells to a computing device, wherein the energy-storing apparatus is configured to provide energy to the plurality of sensing units and the wireless communication unit during an operating event;

a power source configured to provide energy to the sensing units and the wireless communication unit only when the non-operating event begins; and a processor configured to switch a supply of the energy from the energy-storing apparatus to the power source when the non-operating event begins.

7. The vehicle of claim 6, wherein the monitored conditions includes one of a voltage status, a temperature status, a strain status, and a pressure status.

8. The vehicle of claim 6, wherein the power source is a self-harvesting power source.

9. A method for monitoring an energy-storing apparatus during a non-operating event, the apparatus including a plurality of energy-storing cells, comprising:

monitoring conditions occurring within a subset of the plurality of cells during the non-operating event via a sensing unit associated with the subset of cells, wherein the non-operating event corresponds to when electrical current is not flowing to or from the energy-storing apparatus;

generating and communicating a signal indicative of one of the monitored conditions of the corresponding subset of cells to a computing device via a wireless communication unit coupled to the sensing unit;

providing energy to the sensing unit and the wireless communication unit via the energy-storing apparatus; and switching from providing energy to the sensing unit and the wireless communication unit via the energy-storing apparatus to providing energy to the sensing unit and the wireless communication unit via a self-harvesting power source only when the non-operating event begins.

10. A non-transitory computer readable medium including a processor for performing instructions corresponding to a method for monitoring an energy-storing apparatus during an non-operating event, the apparatus including a plurality of energy-storing cells, the method comprising:

monitoring conditions occurring within a subset of the plurality of cells during the non-operating event via a sensing unit associated with the subset of cells, wherein the non-operating event corresponds to when electrical current is not flowing to or from the energy-storing apparatus;

generating and communicating a signal indicative of one of the monitored conditions of the corresponding subset of cells to a computing device via a wireless communication unit coupled to the sensing unit; and providing energy to the sensing unit and the wireless communication unit via the energy-storing apparatus; and switching from providing energy to the sensing unit and the wireless communication unit via the energy storing apparatus to providing energy to the sensing unit and the wireless communication unit via a self-harvesting power source only when the non-operating event begins.

11. The non-transitory computer readable medium of claim 10, wherein the monitored conditions includes one of a voltage status, a temperature status, a strain status, and a pressure status.

12. The non-transitory computer readable medium of claim 10, wherein the indicative signal is generated when one of the monitored conditions reaches a corresponding threshold level.

13. The system of claim 1, wherein the self-harvesting power is generated by vibration energy.

14. The system of claim 1, wherein the signal indicative of one of the monitored conditions is generated when one of the monitored conditions reaches a value outside of a predetermined range and when a duration of time over which the value is outside of the predetermined range exceeds a duration threshold.

15. The system of claim 8, wherein the self-harvesting power source generates power by vibration energy.

16. The system of claim 6, wherein the signal indicative of one of the monitored conditions is generated when one of the monitored conditions reaches a value outside of a predetermined range and when a duration of time over which the value is outside of the predetermined range exceeds a duration threshold.

17. The method of claim 9, wherein the self-harvesting power is generated by vibration energy.

18. The method of claim 9, wherein the signal indicative of one of the monitored conditions is generated when one of the monitored conditions reaches a value outside of a predetermined range and when a duration of time over which the value is outside of the predetermined range exceeds a duration threshold.

19. The non-transitory computer readable medium of claim 10, wherein the self-harvesting power is generated by vibration energy.

20. The system of claim 10, wherein the signal indicative of one of the monitored conditions is generated and communicated when one of the monitored conditions reaches a value outside of a predetermined range and when a duration of time over which the value is outside of the predetermined range exceeds a duration threshold.

* * * * *